(12) United States Patent
Kim

(10) Patent No.: US 9,743,525 B2
(45) Date of Patent: Aug. 22, 2017

(54) ELECTRONIC DEVICE EMBEDDED SUBSTRATE AND MANUFACTURING METHOD THEREOF

(71) Applicant: Samsung Electro-Mechanics Co., Ltd., Suwon-si (KR)

(72) Inventor: Bong-Soo Kim, Sejong (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 6 days.

(21) Appl. No.: 14/963,690

(22) Filed: Dec. 9, 2015

(65) Prior Publication Data
US 2016/0165733 A1    Jun. 9, 2016

(30) Foreign Application Priority Data
Dec. 9, 2014  (KR) .................. 10-2014-0175638

(51) Int. Cl.
 H05K 1/18   (2006.01)
 H05K 3/32   (2006.01)
 H05K 3/46   (2006.01)
 H05K 3/00   (2006.01)

(52) U.S. Cl.
 CPC .............. *H05K 1/183* (2013.01); *H05K 1/186* (2013.01); *H05K 3/325* (2013.01); *H05K 3/326* (2013.01); *H05K 3/4602* (2013.01); *H05K 3/4697* (2013.01); *H05K 3/0047* (2013.01); *H05K 2201/0382* (2013.01); *H05K 2201/0394* (2013.01); *H05K 2203/107* (2013.01)

(58) Field of Classification Search
 CPC ......... H05K 1/183; H05K 3/325; H05K 3/326
 See application file for complete search history.

(56) References Cited

U.S. PATENT DOCUMENTS 6,077,106 A * 6/2000 Mish .................. G06K 19/0706
                                                    361/761

FOREIGN PATENT DOCUMENTS

| KR | 10-0820633 B1    | 4/2008  |
|----|------------------|---------|
| KR | 10-2009-0126537 A | 12/2009 |
| KR | 10-2014-0048042 A | 4/2014  |
| KR | 10-2015-0062056 A | 6/2015  |

OTHER PUBLICATIONS

Korean Office Action mailed Aug. 18, 2015 in counterpart Korean Application No. 10-2014-0175638 (1 page in English, 6 pages in Korean).

\* cited by examiner

*Primary Examiner* — Jeremy C Norris
(74) *Attorney, Agent, or Firm* — NSIP Law

(57) ABSTRACT

An electronic device embedded substrate and a method of manufacturing the same includes a substrate comprising a cavity formed therein, and an electronic device embedded in the cavity. The substrate and method thereof also include a first support pattern part formed on one surface of the substrate and pressing the electronic device to restrict a movement of the electronic device within the cavity, and a second support pattern part formed on another surface of the core substrate facing opposite to the one surface and extended toward an inside of the cavity to support the electronic device.

18 Claims, 6 Drawing Sheets

ELECTRONIC DEVICE EMBEDDED SUBSTRATE AND MANUFACTURING METHOD THEREOF

CROSS-REFERENCE TO RELATED APPLICATIONS

This application claims the benefit under 35 USC 119(a) of Korean Patent Application No. 10-2014-0175638, filed with the Korean Intellectual Property Office on Dec. 9, 2014, the disclosure of which is incorporated herein by reference in its entirety.

BACKGROUND

1. Field

The following description relates to an electronic device embedded substrate and a manufacturing method thereof.

2. Description of Related Art

As electronic products become increasingly smaller, there have been increased demands that circuit boards embedded in these electronic products become more integrated and thinner. Accordingly, printed circuit boards having electronic devices embedded therein have been build to cope with these demands.

The electronic devices embedded printed circuit board are formed through an embedding process, which involves forming a cavity in a core substrate, placing an electronic device in the cavity and then securing the electronic device in the cavity using a filler or an adhesive tape. As the electronic device is embedded in the printed circuit board manufactured through this embedding process, it becomes possible to realize a smaller and more integrated printed circuit board.

However, because the electronic device has been fixed in the cavity using the filler or the adhesive tape in the conventional electronic device embedded printed circuit board, manufacturing costs are quite high and the manufacturing processes are complex due to the inevitable process of attaching and detaching the adhesive tape.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a substrate including a substrate comprising a cavity formed therein; an electronic device embedded in the cavity; a first support pattern part formed on one surface of the substrate and pressing the electronic device to restrict a movement of the electronic device within the cavity; and a second support pattern part formed on another surface of the core substrate facing opposite to the one surface and extended toward an inside of the cavity to support the electronic device.

The substrate may also include a first circuit pattern part formed on the one surface of the substrate, wherein the first support pattern part may extend from the first circuit pattern part.

The electronic device may include terminals formed on a surface thereof, and wherein the first support pattern part is electrically connected to the terminals.

The first support pattern part may include a pair of first support members protruded from inside surfaces of the cavity facing opposite to each other, and bent toward the inside of the cavity, and wherein the electronic device may be interposed between end portions of the first support members to be in contact with end portions of the first support members.

Each end portion of the first support members may be curved toward the other surface of the core substrate.

The second support pattern part may be formed to cover an opening of the first support pattern part.

The substrate may also include a second circuit pattern part formed on the other surface of the substrate, and wherein the second support pattern part may extend from the second circuit pattern part.

The electronic device may include terminals formed on a surface thereof, and wherein the second support pattern part may be electrically connected to the terminals.

The second support pattern part may be in contact with a bottom surface of the electronic device.

The first support pattern part may apply an even pressure to at least one of the lateral surface sides of the electronic device to restrict a lateral-direction movement of the electronic device.

In accordance with an embodiment, there is provided a method, including forming a first support pattern part and a second support pattern part on one surface of a substrate and another surface of the substrate, respectively; forming a cavity by removing a portion of the substrate corresponding to a position in which an electronic device is to be embedded; embedding the electronic device in the cavity by inserting the electronic device from the one surface of the substrate to the other surface of the substrate; and laminating an insulation layer on at least one surface of the substrate.

The forming of the first support pattern part may extend from a first circuit pattern part formed on the one surface of the core substrate.

The first support pattern part may include a pair of first support members protruded from inside surfaces of the cavity, facing opposite to each other, and bent toward an inside of the cavity, and wherein the electronic device may be interposed between end portions of the first support members to be in contact with end portions of the first support members.

Each end portion of the first support members may protrude with a greater length than a distance of separation between an inside surface of the cavity and a lateral surface of the electronic device.

In the forming of the second support pattern part, the second support pattern part may extend from a second circuit pattern part formed on the other surface of the substrate.

The second support pattern part may be formed to cover an opening of the first support pattern part.

The second support pattern part may extend with a greater length than a distance of separation between an inside surface of the cavity and a lateral surface of the electronic device to make contact with a bottom surface of the electronic device embedded in the cavity.

The method may also include forming a via hole operatively connected with the first support pattern part, the second support pattern part, or the electronic device; and forming an additional circuit pattern part, operatively connected with the via hole, on the insulation layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
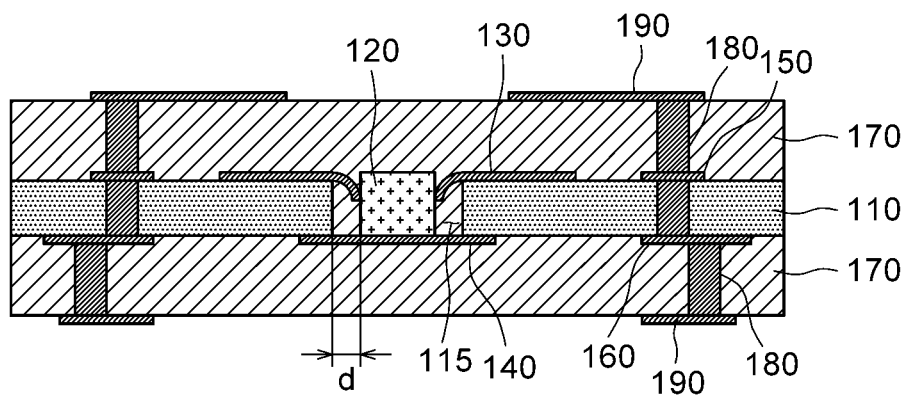
FIG. 1 is a cross-sectional view showing a structure of an electronic device embedded substrate, in accordance with an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms such as "first" and "second" can be used in merely distinguishing one element from other identical or corresponding elements, but the above elements shall not be restricted to the above terms.

It will be understood that when an element or layer is referred to as being "on", "coupled", or "connected to" another element or layer, it can be directly on or connected to the other element or layer or through intervening elements or layers may be present. In contrast, when an element is referred to as being "directly on", "directly coupled to", or "directly connected to" another element or layer, there are no intervening elements or layers present. Like reference numerals refer to like elements throughout. As used herein, the term "and/or" includes any and all combinations of one or more of the associated listed items.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below.

FIG. 1 is a cross-sectional view showing a structure of an electronic device embedded substrate, in accordance with an embodiment.

Referring to FIG. 1, an electronic device embedded substrate 100, in accordance with an embodiment, includes a core substrate 110, an electronic device 120, a first support pattern part 130 and a second support pattern part 140.

The core substrate 110 includes a cavity 115, which is formed by having a portion of an insulation resin layer perforated. In one example, the core substrate 110 is made of a reinforcement base material and resin. Moreover, the size of the cavity 115 formed in the core substrate 110 corresponds to or is greater than that of the electronic device 120 in order to have the electronic device 120 embedded therein.

The electronic device 120 is electrically connected to an external structural device to perform a predetermined function. The electronic device 120 of the electronic device embedded substrate 100, in accordance with an embodiment, may be a multilayer ceramic capacitor that includes a capacitor body and a terminal. However, the embodiment is not limited to such configuration, and various types of electronic devices may be included in the embodiment.

The first support pattern part 130 is formed on one surface of the core substrate 110 and at least an end portion of the first support pattern part 130 is configured to press onto at least a point or an area on a lateral surface side of the electronic device 120 to restrict the electronic device 120 from moving sideways or upwardly within the cavity 115. Specifically, the first support pattern part 130, in accordance with an embodiment, is configured to fix in place the electronic device 120 within the cavity 115 by pressing the electronic device 120.

In one example, the cavity 115 is formed to be larger than the electronic device 120. In this example, the electronic device 120 moves within the cavity 115 to have a displacement corresponding to a distance (d) between an inside surface of the cavity 115 and an outside surface of the electronic device 120. Accordingly, fastening the electronic device 120 within the cavity 115 becomes an important task in manufacturing the electronic device embedded substrate 100.

The electronic device embedded substrate 100, in accordance with an embodiment, includes the first support pattern part 130, which, as illustrated in FIG. 1, is formed to press at least one of the lateral surface sides of the electronic device 120 simultaneously. As the first support pattern part 130 applies an even pressure applied to the at least one of the lateral surface sides of the electronic device 120, a lateral-direction movement of the electronic device 120 is restricted.

Although it is illustrated in FIG. 1 that the first support pattern part 130 is configured to press the electronic device 120 at one or both of the lateral surface sides thereof, it is possible that the first support pattern part 130 is configured to press the electronic device 120 at one lateral surface side thereof only. In such a case, the other lateral surface of the electronic device 120 that is opposite to the one lateral surface side that is being pressed by the first support pattern part 130 is in contact with an inside surface of the cavity 115 to restrict the lateral-direction movement of the electronic device 120.

Conventionally, an electronic device is fixed within a cavity by initially stabilizing the electronic device using an adhesive material and then removing the adhesive material after the required process is completed. However, the electronic device embedded substrate 100, in accordance with an embodiment, includes the first support pattern part 130, which presses the electronic device 120 to fixably place the electronic device 120 within the cavity 115, without requiring the aforementioned adhesive material.

The electronic device embedded substrate 100, in accordance with an embodiment, includes the second support pattern part 140, which supports the electronic device 120 in such a way that the movement of the electronic device 120 is restricted within the cavity 115 in a sturdier manner. The second support pattern part 140 is formed on the other surface of the core substrate 110 facing opposite to the one surface of the core substrate 110 on which the first support pattern part 130 is formed.

More specifically, the second support part 140, in accordance with an embodiment, is formed to be extended along an inside of the cavity 115 so as to support the electronic device 120 embedded in the cavity 115. As shown in FIG. 1, the second support pattern part 140 supports the electronic device 120 by being extended from one end of a lower surface of the core substrate 110, along the inside of the cavity 115, to another end of the lower surface of the core substrate 110. The lower surface of the core substrate 110 faces opposite to an upper surface of the core substrate 110 on which the first support pattern part 130 is formed.

In one example, as illustrated in FIG. 1, the second support pattern part 140 is in direct contact with a bottom surface of the electronic device 120 to support the bottom surface of the electronic device 120. However, the embodiment is not limited to what is illustrated in FIG. 1, an additional support member may be interposed between the second support pattern part 140 and the bottom surface of the electronic device 120. The second support pattern part 140 may be in indirect contact with the bottom surface of the electronic device 120.

As described above, the second support pattern part 140 of the electronic device embedded substrate 100, in accordance with an embodiment supports the bottom surface of the electronic device 120. Thus, a longitudinal-direction movement of the electronic device 120 is restricted by the second support pattern part 140. Accordingly, the electronic device 120 embedded in the cavity 115 may be supported within the cavity 115 in a more sturdy fashion.

Figure 2:
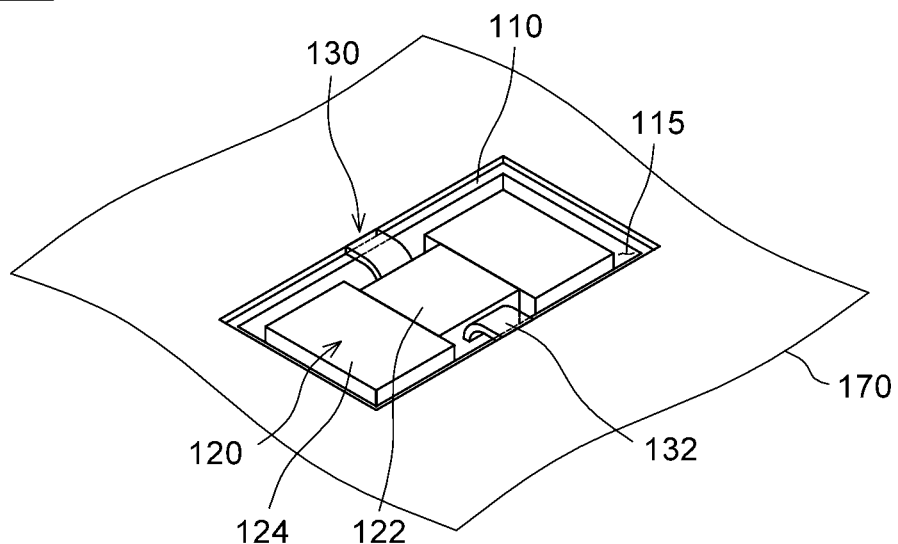
FIG. 2 shows a first support pattern part of the electronic device embedded substrate shown in FIG. 1.
Figure 3:
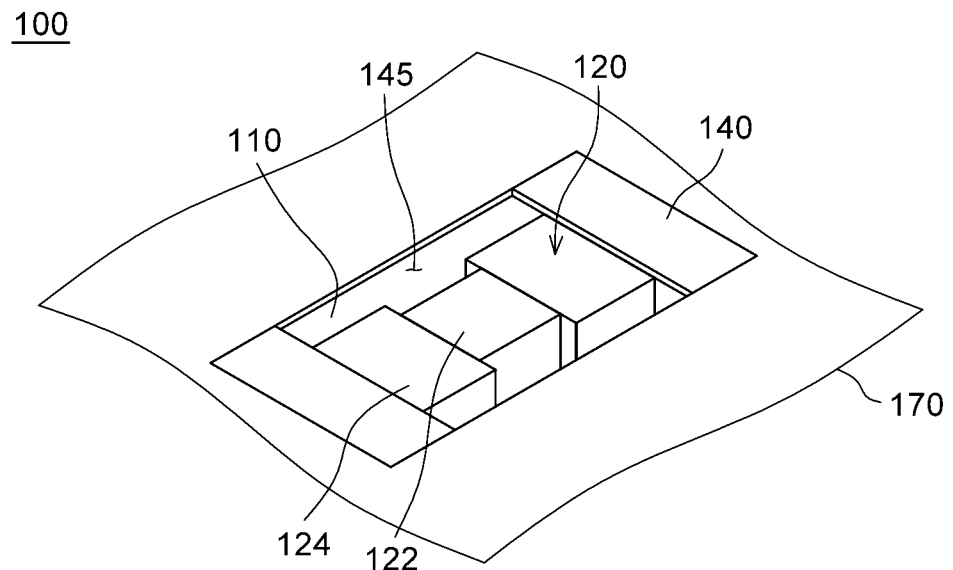
FIG. 3 shows a second support pattern part of the electronic device embedded substrate shown in FIG. 1.

FIG. 2 shows the first support pattern part 130 of the electronic device embedded substrate 100 shown in FIG. 1, and FIG. 3 shows the second support pattern part 140 of the electronic device embedded substrate 100 shown in FIG. 1.

Illustrated in FIG. 2 is one surface, such as the upper surface, of the core substrate 110 on which the first support pattern part 130 is formed, and in FIG. 2 another surface, such as the lower surface, of the core substrate 110 on which the second support pattern part 140 is formed.

Referring to FIG. 1 and FIG. 2, the electronic device embedded substrate 100, in accordance with an embodiment, further includes a first circuit pattern part 150 formed on the one surface of the core substrate 110. The first circuit pattern part 150 is formed on the upper surface of the core substrate 110 on which the first support pattern part 130 is formed.

The first circuit pattern part 150 is formed in a predetermined pattern on the upper surface of the core substrate 110 in order to transmit electrical signals. In one example, the first circuit pattern part 150 is made of a conductive material having a good electric conductivity.

The first support pattern part 130, in accordance with an embodiment is formed by being extended from the first circuit pattern part 150, on the upper surface of the core substrate 110. In such a case, the first circuit pattern part 150 and the first support pattern part 130 are formed simultaneously to stabilize the electronic device 120 and to simplify manufacturing processes.

Moreover, because the first support pattern part 130 is made of a conductive material having a good electric conductivity, similarly to the first circuit pattern part 150, the first support pattern part 130 may be electrically connected to the first circuit pattern part 150.

Referring to FIG. 2, the electronic device 120 includes a main body 122 and terminals 124. The terminals 124 of the electronic device 120 are formed on a surface of the electronic device 120. That is, the terminals 124 of the electronic device 120 are formed to be exposed.

In one example, the first support pattern part 130 is electrically connected to the terminals 124 of the electronic device 120. In another example, the first support pattern 130 is electrically connected to the main body 122 of the electronic device 120. In such a case, because no additional connection member is required to connect the electronic device 120 with external power, it is possible to simplify the structure and save manufacturing costs.

Furthermore, referring to FIG. 1, because the first support pattern part 130 presses onto the electronic device 120, while the first support pattern part 130 is in contact with both lateral surfaces of the electronic device 120, to secure or fix the electronic device 120 within the cavity 115; thus, maintaining a sturdy electrical connection. Also, the terminals 124 of the electronic device 120 are formed on either lateral surface of the electronic device 120 in contact with the first support pattern part 130.

Referring to FIG. 1 and FIG. 3, the electronic device embedded substrate 100, in accordance with an embodiment, further includes a second circuit pattern part 160 formed on the other surface of the core substrate 110. Similarly to the first circuit pattern part 150, the second circuit pattern part 160 is formed in a predetermined pattern on the other surface of the core substrate 110 in order to transmit electrical signals, and is made of a conductive material having a good electric conductivity.

In one example, the second support pattern part 140 is configured to extend from the second circuit pattern part 160. In one configuration, the second support pattern part 140 is integrally formed with the second circuit pattern part 160; thus, no additional process is needed to form the second support pattern part 140; thus, improving a productivity.

Moreover, because the second support pattern part 140 supports the electronic device 120 by being in contact with the bottom surface of the electronic device 120, the second support pattern part 140 is electrically connected with the electronic device 120 in the case where the terminals 124 of the electronic device 120 are formed on a surface of the electronic device 120 that is in contact with the second support pattern part 140.

For instance, the terminals 124 of the electronic device 120 are selectively connected with the first support pattern part 130 or the second support pattern part 140 to have external power supplied thereto. For instance, the terminals 124 of the electronic device 120 are electrically connected to the first support pattern part 130 and the first circuit pattern part 150 allowing to have the external power supplied thereto, and allowing external transmission of electric signals through the first circuit pattern part 150.

Referring to FIG. 3, the second support pattern part 140 has an opening 145 formed at a portion thereof. That is, the second support pattern part 140 is formed in a shape in which a position thereof that corresponds to the first support pattern part 130 is open. In an embodiment, because the first support pattern part 130 is formed to press one or both of the lateral surface sides of the main body 122 of the electronic device 120, the second support pattern part 140 is formed in a shape in which both lateral surfaces sides of the main body 122 of the electronic device 120 are open.

Accordingly, by forming the portion of the second support pattern part 140 corresponding to the first support pattern part 130 to be open, the configurations of the first support part 130 and the second support pattern part 140 do not allow unfilled space when insulation resin is filled in the cavity 115, thereby forming an insulation layer more effectively.

Referring to FIG. 2, the first support pattern part 130 of the electronic device embedded substrate 100, in accordance with an embodiment, includes at least one pair of first support members 132, which are protruded toward the inside of the cavity 115 from inside surfaces, respectively, of the cavity 115 facing with each other. In one example, the electronic device 120 is interposed between end portions of the first support members 132 so that the electronic device 120 is in contact with the end portions of the first support members 132.

As illustrated in FIG. 2, the first support pattern part 130 includes a pair of first support members 132 that are arranged to face opposite to each other. The first support members 132 may be each protruded from the inside surface of the cavity 115 to be in contact with the lateral surface side of the electronic device 120. In accordance with an alternative embodiment, one first support member 132 may be formed to be in contact with one lateral surface side of the electronic device 120. In a further alternative embodiment, a pair of first support members 132 are arranged to face opposite to each other to be in contact with the lateral surface sides of the electronic device 120. In the same alternative embodiment, another pair of first support members 132 are arranged to face opposite to each other to be in contact with upper and lower surface sides of the electronic device 120.

Although it is illustrated in FIG. 2 that a pair of first support members 132 are in contact with the main body 122 of the electronic device 120, the embodiments are not restricted to what is illustrated herein, and it is possible that the pair of first support members 132 may each protrude from a different inside surface of the cavity 115, in such a way that the pair of first support members 132 are in contact with the terminals 124 of the electronic device 120.

In an embodiment where the first support pattern part 130 includes the pair of first support members 132 that are formed to face opposite to each other, the electronic device 120 is stabilized in a more sturdy fashion because the pair of first support members 132 press the electronic device 120 at either lateral surface thereof, in opposite directions in the cavity 115.

Moreover, as illustrated in FIG. 1 and FIG. 2, the pair of first support members 132, in accordance with an embodiment, each has the end portion thereof formed to be curved toward the other surface of the core substrate 110 on which the second support pattern part 140 is formed. That is, a cross-section of each of the first support members 132 has a curved shape. A person skilled in the art will appreciate that the cross-section of each of the first support members 132 may be formed in other shapes, such as linear or non-linear shapes. Also, the curvatures of the first support members 132 may be formed of regular or irregular shapes.

In the case where the first support members 132 are shaped to be curved, it is possible for the first support members 132 to give lateral-direction pressure to the electronic device 120. A longitudinal-direction frictional force is generated between an upper surface of the first support member 132 and a lateral surface of the electronic device 120.

That is, the first support members 132 is deformed to curved shapes while the electronic device 120 is being embedded, and the electronic device 120 is pressed in the lateral direction by an elastic force of the first support members 132 resisting this deformation.

Moreover, as the first support members 132 are formed to be curved, the upper surfaces of the first support members 132 are in contact with the lateral surfaces of the electronic device 120, respectively, and the frictional force is generated in proportion to contact areas.

As a result, the first support members 132 press the electronic device 12 in the lateral direction so as to restrict the movement of the electronic device 120 in the lateral direction and generate the frictional force onto the electronic device 120 so as to restrict the movement of the electronic device 120 in the longitudinal direction. Moreover, the longitudinal movement of the electronic device 120 within the cavity 115 may be further restricted by the second support pattern part 140, which supports the electronic device 120, by being in contact with the bottom surface of the electronic device 120.

The electronic device embedded substrate 100, in accordance with an embodiment, further includes an insulation layer 170, a via hole 180, and an additional circuit pattern part 190, as shown in FIG. 1.

The insulation layer 170 is laminated on at least one surface of the core substrate 110. In one example, the insulation layer 170 is filled in the cavity 115 to protect the electronic device 120. The insulation layer 170 envelops the electronic device 120 in the cavity 115 to fix a position of the electronic device 120. The insulation layer 170 is made of an insulation material, for example, prepreg.

The via hole 180 connects the first circuit pattern part 150 with the second circuit pattern part 160 electrically or electrically connects the first circuit pattern part 150 and the second circuit pattern part 160 with the additional circuit pattern part 190.

In an example, the via hole 180 penetrates the insulation layer 170 to interconnect the circuit pattern parts that are located at different layers. Moreover, the via hole 180 connects the electronic device 120 with the circuit pattern parts electrically. The first support pattern part 130 and the second support pattern part 140 press or support the electronic device 120 by being formed in areas excluding where the via hole 180 is formed.

The additional circuit pattern part 190 is electrically connected to an external device and transfers electric signals to the first circuit pattern part 150 or the second circuit pattern part 160. Thus, the additional circuit pattern part 190 is formed on the insulation layer 170.

Figure 4:
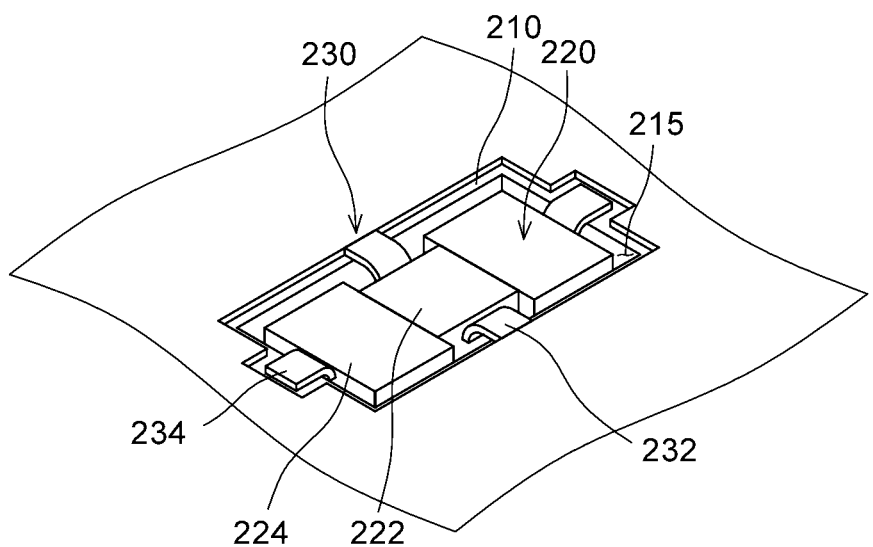
FIG. 4 shows a first support pattern part of an electronic device embedded substrate, in accordance with another embodiment.
Figure 5:
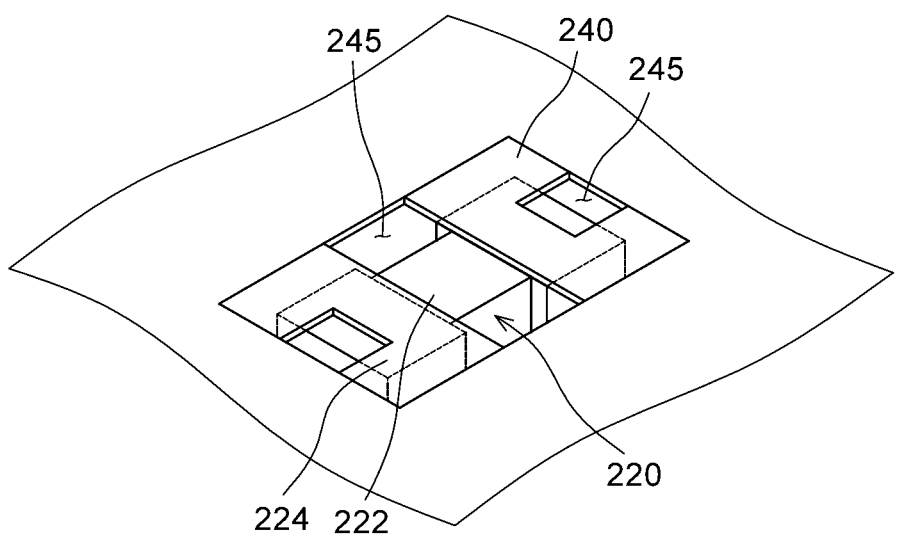
FIG. 5 shows a second support pattern part of an electronic device embedded substrate, in accordance with another embodiment.

FIG. 4 shows a first support pattern part 230 of an electronic device embedded substrate 200, in accordance with another embodiment of the present invention, and FIG. 5 shows a second support pattern part 240 of the electronic device embedded substrate 200 in accordance with another embodiment of the present invention.

Referring to FIG. 4 and FIG. 5, the electronic device embedded substrate 200 in accordance with an embodiment, includes the first support pattern part 230 and the second support pattern part 240 that support an electronic device 220. Hereinafter, any description provided already with reference to FIG. 1, FIG. 2 and FIG. 3 will not be redundantly provided.

The first support pattern part 230, in accordance with an embodiment includes two pairs of first support members 232, 234, which intersect with each other. Referring to FIG. 4, one pair of the first support members 232 is formed to be in contact with a main body 222 of the electronic device 220. The other pair of the first support members 234 is formed to be in contact with terminals 224 of the electronic device 220.

Any one pair of the first support members 232, 234 may be electrically connected with the electronic device 220 to perform a function of supplying external power. Moreover, any one pair of the first support members 232, 234 or all of the first support members 232, 234 extend from a first circuit pattern part formed on one surface of a core substrate 210.

In the case where the first support members 232, 234 are each formed at different inner surface sides of a cavity 215 and press the electronic device 220 from the different inner surface sides of the cavity 215, a sturdy stabilization or positioning of the electronic device 220 is provided.

Referring to FIG. 5, the second support pattern part 240 has openings 245 formed at portions corresponding to the first support pattern part 230. Specifically, the second support pattern part 240 has the openings 245 formed at the portions corresponding to the main body 222 and the terminals 224 of the electronic device 220.

That is, by having the openings 245 corresponding to the four first support members formed at the second support pattern part 240, in accordance with an embodiment, an insulation material effectively filled in the cavity.

Figure 6:
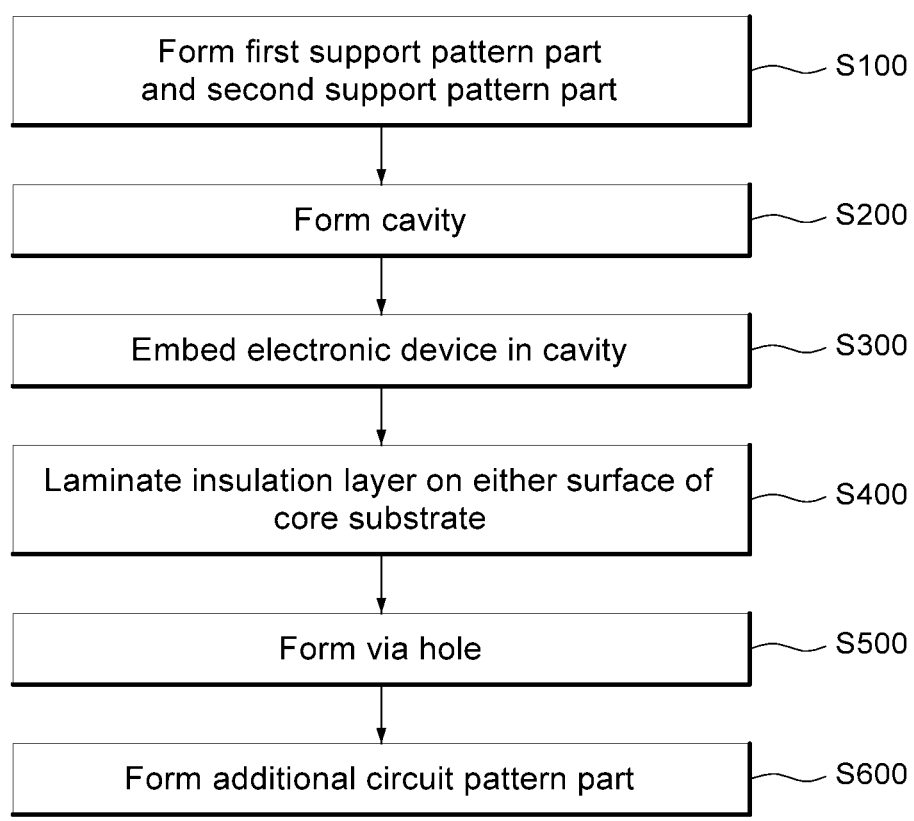
FIG. 6 is a flow diagram showing a method of manufacturing an electronic device embedded substrate, in accordance with an embodiment.

FIG. 6 is a flow diagram showing a method of manufacturing an electronic device embedded substrate, in accordance with an embodiment, and FIG. 7, FIG. 8, FIG. 9, FIG. 10 and FIG. 11 describe a method of manufacturing an electronic device embedded substrate, in accordance with an embodiment.

Figure 7:
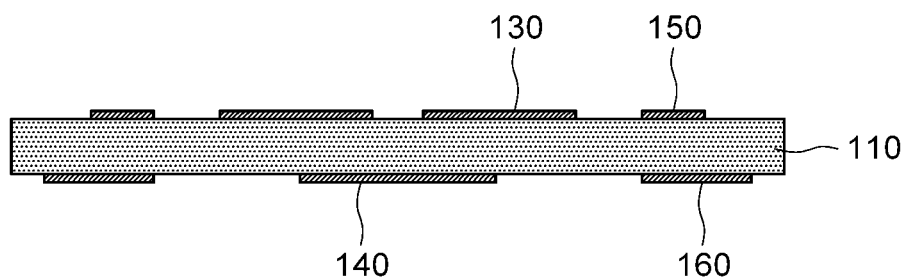
FIG. 7, FIG. 8, FIG. 9, FIG. 10 and FIG. 11 show steps of the method of manufacturing an electronic device embedded substrate, in accordance with an embodiment.
Figure 8:
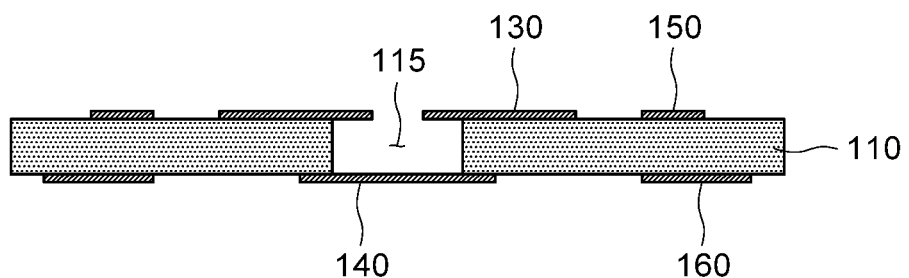
Figure 9:
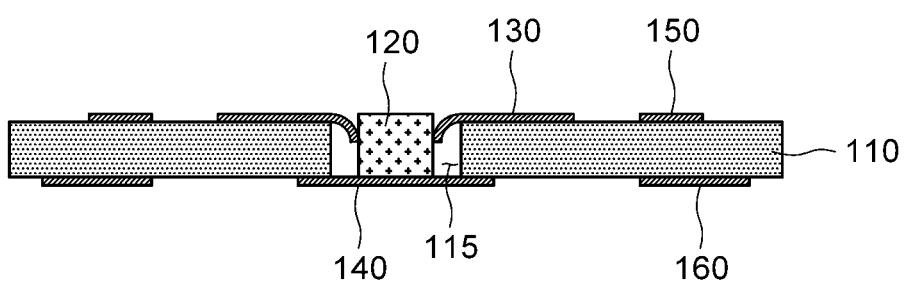
Figure 10:
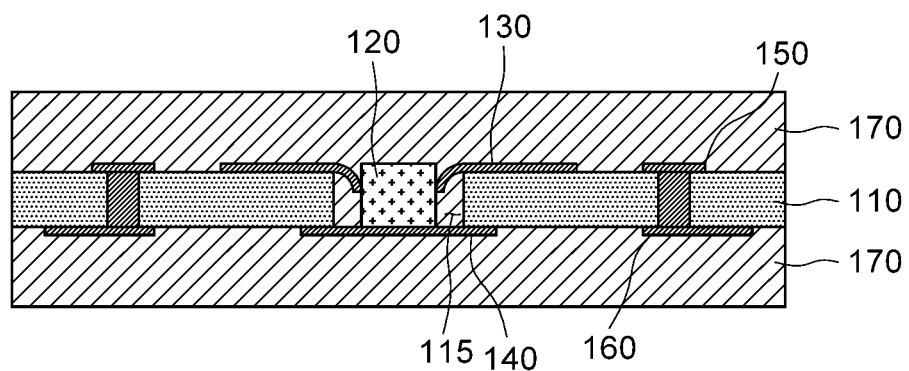

Referring to FIG. 6, a method to manufacture an electronic device embedded substrate includes, at operation S100 and as illustrated in FIG. 7, a first support pattern part and a second support pattern part are respectively formed on one surface of a core substrate and the other surface of the core substrate facing opposite to the one surface corresponding to a position at which an electronic device is embedded. At operation S200 and as illustrated in FIG. 8, the method forms a cavity by removing a portion of the core substrate corresponding to the position at which the electronic device is embedded. At operation S300 and as illustrated in FIG. 9, the electronic device is embedded in the cavity from the one surface of the core substrate to the other surface of the core substrate. At operation S400 and as illustrated in FIG. 10, the method laminates an insulation layer on at least one surface of the core substrate.

In operation S100 in which the first support pattern part and the second support pattern part are formed to press or support the electronic device embedded in the cavity, a metal layer is laminated on the one surface of the core substrate 110. Then, as illustrated in FIG. 7, the first support pattern part 130 and the second support pattern part 140 are formed by patterning the laminated metal layer on the core substrate 110 corresponding to the position at which the electronic device is to be embedded.

In one example, a first circuit pattern part 150 is formed for transmission of electrical signals, and the first support pattern part 130 is formed to be extended from the first circuit pattern part 150. Likewise, in operation S100, a second circuit pattern part 160 is formed on the other surface of the core substrate 100, and the second support pattern part 140 is formed to be extended from the second circuit pattern part 160.

The first support pattern part 130, the first circuit pattern part 150, the second support pattern part 140 and the second circuit pattern part 160 are formed using various methods, for example, a subtractive method, in which portions of a metal layer are selectively removed, an additive method, in which a wiring pattern is additionally formed on an insulation using electroless plating and electrolytic plating, and an inkjet method, in which conductive ink is printed on an insulation layer. Moreover, the metal layer is a thin film form of conductive material.

Moreover, at operation S100, the first support pattern part 130 is processed to include at least one pair of first support members 132 that are formed to be protruded toward an inside of the cavity 115 from inside lateral surface sides of the cavity 115 that are facing opposite to each other. In an example, the electronic device 120 is embedded in the cavity 115 in such a way that the electronic device 120 is interposed between terminals of the first support members 132 such that the electronic device 120 is in contact with every terminal of the first support members 132.

Moreover, at operation S100, the first support members 132 included in the first support pattern part 130 are formed to protrude with a greater length than a distance of separation between an inside surface of the cavity 115 and a lateral surface of the electronic device 120. As a result, when the electronic device 120 is embedded in the cavity 115, the electronic device 120 presses onto the first support members 132 while being inserted in the cavity 115, and the first support members 132 curve by a pressing force of the electronic device 120, thereby pressing lateral surface sides of the electronic device 120.

In operation S100, the second support pattern part 140 is formed to have an open shape at a position thereof corresponding to the first support pattern part 130. By forming an opening at an area of the second support pattern part 140 corresponding to the first support pattern part 130, the insulation layer is effectively filled in the cavity 115.

Furthermore, the second support pattern part 140 is formed to be extended with a greater length than the distance of separation between the inside surface of the cavity 115 and the lateral surface side of the electronic device 120 such that the second support part 140 makes contact with a bottom surface of the electronic device 120 embedded in the cavity. That is, the second support pattern part 140 is extended in such a way that the second support pattern part 140 is in contact with the bottom surface of the electronic device 120, from the inside of the cavity 115.

Referring to FIG. 8, in operation S200), the cavity 115 is formed by laser-drilling a portion of the core substrate 110, corresponding to the position at which the electronic device 120 is to be embedded. Accordingly, the cavity 115 is formed so that the first support pattern part 130 and the second support pattern part 140 of the core substrate are protruded toward the inside of the cavity 115.

Referring to FIG. 9, in operation S300, the electronic device 120 is inserted in the cavity 115 from one surface to another surface of the core substrate 110. That is, when the electronic device 120 is inserted in the cavity 115, the electronic device 120 is inserted from one surface to the other surface of the core substrate 110 such that the electronic device 120 makes contact with the first support pattern part 130 and then with the second support pattern part 140.

As the electronic device 120 is inserted in the cavity 115, as described above, a bottom surface of the electronic device 120 is in contact with the second support pattern part 140. The bottom surface of the electronic device 120 is stably supported by the second support pattern part 140. The first support pattern part 130 presses upper lateral surfaces of the electronic device 120.

As illustrated in FIG. 10, at operation S400, the insulation layer 170 is laminated on at least one surface of the core substrate 110, and the insulation layer 170 is filled in the cavity 115 formed in the core substrate 110. In one example, by filling the insulation layer 170 in the cavity 115, the electronic device 120 is stabilized by enveloping the electronic device 120 embedded in the cavity 115.

Figure 11:
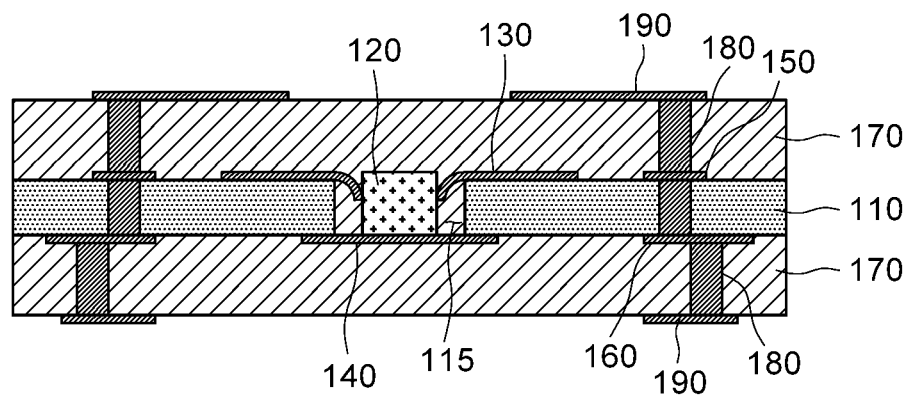

As illustrated in FIG. 11, the method of manufacturing an electronic device embedded substrate in accordance with an embodiment, also includes, at operation S500, forming a via hole, and at operation S600, the method forms an additional circuit pattern part.

In operation S500, the via hole 180 is connected with the first support pattern part 130, the second support pattern part 140 or the electronic device 120 and is formed by penetrating through the insulation layer 170.

Moreover, the additional circuit pattern part 190, which is connected with the via hole 180, is formed by laminating a metal layer on the insulation layer 170 and then patterning the metal layer.

As the method of manufacturing an electronic device embedded substrate, in accordance with an embodiment, includes forming the first support pattern part and the second support pattern part that fix the position of the electronic device, it is possible to skip a process of fastening the electronic device using an adhesive tape; thus, resulting in an easier process management and an improved productivity.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A substrate comprising:
   a core substrate comprising a cavity formed therein;
   an electronic device embedded in the cavity;
   a first support pattern part formed on one surface of the core substrate and being in contact with a lateral surface of the electronic device by having an end portion thereof formed in a space formed between the lateral surface of the electronic device and the cavity.

2. The substrate of claim 1, further comprising:
   a first circuit pattern part formed on the one surface of the core substrate,
   wherein the first support pattern part extends from the first circuit pattern part.

3. The substrate of claim 2, wherein the electronic device comprises terminals formed on a surface thereof, and
   wherein the first support pattern part is electrically connected to the terminals.

4. The substrate of claim 1, wherein the first support pattern part comprises a pair of first support members protruded from inside surfaces of the cavity facing opposite to each other, and bent toward the inside of the cavity, and
   wherein the electronic device is interposed between end portions of the first support members to be in contact with end portions of the first support members.

5. The substrate of claim 1, further comprising a second support pattern part formed on another surface of the core substrate facing opposite to the one surface and extended toward an inside of the cavity to support the electronic device.

6. The substrate of claim 5, wherein the second support pattern part is formed to cover an opening of the first support pattern part.

7. The substrate of claim 5, further comprising:
   a second circuit pattern part formed on the other surface of the core substrate, and
   wherein the second support pattern part extends from the second circuit pattern part.

8. The substrate of claim 7, wherein the electronic device comprises terminals formed on a surface thereof, and
   wherein the second support pattern part is electrically connected to the terminals.

9. The substrate of claim 5, wherein the second support pattern part is in contact with a bottom surface of the electronic device.

10. The substrate of claim 1, wherein the first support pattern part is formed in a pair.

11. A method, comprising:
    forming a first support pattern part and a second support pattern part on one surface of a core substrate and another surface of the core substrate, respectively;
    forming a cavity by removing a portion of the core-substrate corresponding to a position in which an electronic device is to be embedded;
    embedding the electronic device in the cavity by inserting the electronic device from the one surface of the core substrate to the other surface of the core substrate; and
    laminating an insulation layer on at least one surface of the core substrate,
    wherein an end portion of the first support pattern part is formed in a space formed between a lateral surface of the electronic device and the cavity to be in contact with the lateral surface of the electronic device.

12. The method of claim 11, wherein the forming of the first support pattern part extends from a first circuit pattern part formed on the one surface of the core substrate.

13. The method of claim 11, wherein the first support pattern part comprises a pair of first support members protruded from inside surfaces of the cavity, facing opposite to each other, and bent toward an inside of the cavity, and
    wherein the electronic device is interposed between end portions of the first support members to be in contact with end portions of the first support members.

14. The method of claim 13, wherein each end portion of the first support members protrudes with a greater length than a distance of separation between an inside surface of the cavity and a lateral surface of the electronic device.

15. The method of claim 11, wherein in the forming of the second support pattern part, the second support pattern part extends from a second circuit pattern part formed on the other surface of the core substrate.

16. The method of claim 11, wherein the second support pattern part is formed to cover an opening of the first support pattern part.

17. The method of claim 16, wherein the second support pattern part extends with a greater length than a distance of separation between an inside surface of the cavity and a lateral surface of the electronic device to make contact with a bottom surface of the electronic device embedded in the cavity.

18. The method of claim 11, further comprising:
   forming a via hole operatively connected with the first support pattern part, the second support pattern part, or the electronic device; and
   forming an additional circuit pattern part, operatively connected with the via hole, on the insulation layer.

\* \* \* \* \*